US012725765B2

(12) United States Patent
Yoo et al.

(10) Patent No.: US 12,725,765 B2
(45) Date of Patent: Sep. 1, 2026

(54) APPARATUS FOR TREATING SUBSTRATE AND METHOD FOR TREATING SUBSTRATE

(71) Applicant: PSK INC., Hwaseong-si (KR)

(72) Inventors: Kwang Sung Yoo, Hwaseong-si (KR); Jong Chan Lee, Hwaseong-si (KR)

(73) Assignee: PSK INC., Hwaseong-si (KR)

( * ) Notice: Subject to any disclaimer, the term of this patent is extended or adjusted under 35 U.S.C. 154(b) by 434 days.

(21) Appl. No.: 18/462,378

(22) Filed: Sep. 6, 2023

(65) Prior Publication Data

US 2024/0087854 A1 Mar. 14, 2024

(30) Foreign Application Priority Data

Sep. 8, 2022 (KR) ........................ 10-2022-0114193

(51) Int. Cl.
*H01J 37/32* (2006.01)

(52) U.S. Cl.
CPC .. *H01J 37/32568* (2013.01); *H01J 37/32348* (2013.01); *H01J 37/32697* (2013.01); *H01J 37/32715* (2013.01); *H01J 37/32733* (2013.01); *H01J 2237/20235* (2013.01); *H01J 2237/3341* (2013.01)

(58) Field of Classification Search
CPC ........... H01J 37/32568; H01J 37/32348; H01J 37/32697; H01J 37/32715; H01J 37/32733; H01J 2237/20235; H01J 2237/3341; H01J 37/32091; H01J 37/32009; H01J 37/20; H01J 37/32623; H01J 2237/334; H01L 21/3065; H01L 21/67069; H01L 21/68742
See application file for complete search history.

(56) References Cited

U.S. PATENT DOCUMENTS 7,858,898 B2 * 12/2010 Bailey, III ........ H01J 37/32366 156/345.47
7,943,007 B2 * 5/2011 Bailey, III .......... H01L 21/0209 156/345.47
2008/0277064 A1 * 11/2008 Kim .................. H01J 37/32091 156/345.38

(Continued)

FOREIGN PATENT DOCUMENTS

KR 1020090000852 A 1/2009
KR 1020090105530 A 10/2009

(Continued)

*Primary Examiner* — Jeffrie R Lund
(74) *Attorney, Agent, or Firm* — Li & Cai Intellectual Property Office

(57) ABSTRACT

The inventive concept provides a substrate treating apparatus. The substrate treating apparatus includes a housing having a treating space; a support unit positioned within the treating space and configured to apply a power and to support a substrate; and a plasma control unit configured to change a characteristic of a plasma formed in the treating space, and wherein the plasma control unit includes: a gap control plate positioned above the support unit; and a plate driver changing a position of the gap control plate, and the plate driver maintains a gap between a bottom surface of the gap control plate and a top surface of the support plate while changing a characteristic of the plasma by changing the position of the gap control plate.

13 Claims, 6 Drawing Sheets

(56) References Cited

U.S. PATENT DOCUMENTS

2014/0020708 A1* 1/2014 Kim .................. H01J 37/32091
134/1.1
2024/0079216 A1* 3/2024 Yoo ................... H01J 37/32091
2024/0087843 A1* 3/2024 Lee ................... H01J 37/32348
2024/0087854 A1* 3/2024 Yoo ................... H01J 37/32715

FOREIGN PATENT DOCUMENTS

KR 1020090110852 A 10/2009
KR 20150013062 A * 2/2015 ........ H01J 37/32137

* cited by examiner

APPARATUS FOR TREATING SUBSTRATE AND METHOD FOR TREATING SUBSTRATE

CROSS-REFERENCE TO RELATED APPLICATIONS

A claim for priority under 35 U.S.C. § 119 is made to Korean Patent Application No. 10-2022-0114193 filed on Sep. 8, 2022, in the Korean Intellectual Property Office, the entire contents of which are hereby incorporated by reference.

BACKGROUND

Embodiments of the inventive concept described herein relate to a substrate treating apparatus, more specifically, a substrate treating apparatus using a plasma.

A plasma refers to an ionized gas state made of ions, radicals, and electrons, and is produced by very high temperatures, strong electric fields, or high-frequency electromagnetic fields. A semiconductor element manufacturing process includes an ashing process or an etching process of removing a film on a substrate using the plasma. The ashing process or the etching process is performed by ion and radical particles contained in the plasma colliding or reacting with the film on the substrate. In general, components installed in a substrate treating apparatus using the plasma are fixedly installed within the apparatus. In particular, components forming an electric field have their positions fixed within the apparatus, constantly maintaining a gap with the substrate according to a set recipe. It is difficult to change characteristics of the electric field or the plasma without changing positions of the components forming the electric field.

SUMMARY

Embodiments of the inventive concept provide a substrate treating apparatus and a substrate treating method for efficiently treating a substrate.

Embodiments of the inventive concept provide a substrate treating apparatus and a substrate treating method for efficiently changing a characteristic of a plasma.

The technical objectives of the inventive concept are not limited to the above-mentioned ones, and the other unmentioned technical objects will become apparent to those skilled in the art from the following description.

The inventive concept provides a substrate treating apparatus. The substrate treating apparatus includes a housing having a treating space; a support unit positioned within the treating space and configured to apply a power and to support a substrate; and a plasma control unit configured to change a characteristic of a plasma formed in the treating space, and wherein the plasma control unit includes: a gap control plate positioned above the support unit; and a plate driver changing a position of the gap control plate, and the plate driver maintains a gap between a bottom surface of the gap control plate and a top surface of the support plate while changing a characteristic of the plasma by changing the position of the gap control plate.

In an embodiment, the plate driver couples with the gap control plate to move the gap control plate in a top/down direction, the support unit further includes a lift unit configured to move the support plate in the top/down direction, and the lift unit moves the support unit in a same direction as the gap control plate moves in a same distance as the gap control plate moves in the top/down direction so the gap between the bottom surface of the gap control plate and the top surface of the support plate is maintained.

In an embodiment, substrate treating apparatus further includes: a bottom edge electrode positioned to surround the support plate and positioned below an edge region of a substrate supported on the support plate; and a top edge electrode positioned to face the bottom edge electrode and positioned above the edge region of the substrate supported on the support plate, and wherein the bottom edge electrode is moved in the top/down direction together with the support plate by the lift unit, and a position of the top edge electrode is fixed within the treating space.

In an embodiment, the plate driver moves the gap control plate and the lift unit moves the support unit, respectively, in a downward direction, so a gap between a bottom surface of the top edge electrode and a top surface of the bottom edge electrode is widened while the gap is maintained.

In an embodiment, the plate driver moves the gap control plate and the lift unit moves the support unit, respectively, in an upward direction, so a gap between a bottom surface of the top edge electrode and a top surface of the bottom edge electrode is narrowed while the gap is maintained.

In an embodiment, the bottom edge electrode and the top edge electrode are grounded.

In an embodiment, the gap control plate is made of a material which includes a dielectric.

In an embodiment, the gap control plate includes: a dielectric plate positioned to face the support plate and made of a material including a dielectric; and a metal plate positioned above the dielectric plate and made of a material including a metal, and the plate driver is coupled to a top end of the metal plate.

The inventive concept provides a substrate treating apparatus. The substrate treating apparatus includes a housing having a treating space; a support unit positioned within the treating space and configured to support a substrate; a lift unit configured to move the support plate; and a plasma control unit configured to change a characteristic of a plasma formed in the treating space, and wherein the plasma control unit includes: a gap control plate positioned above the support unit; and a plate driver moving the gap control plate, and the plate driver changes the characteristic of the plasma by moving the gap control plate, and the lift unit is sync controlled with the plate driver so a gap between a bottom surface of the gap control plate and a top surface of the support plate is maintained at a reference gap set according to a recipe.

In an embodiment, the plate driver moves the gap control plate in a top/down direction, and the lift unit is sync controlled with the plate driver to move the support unit in a same direction as the gap control plate moves in a same distance as the gap control plate moves so the reference gap is maintained.

In an embodiment, the substrate treating apparatus further includes: a bottom edge electrode positioned to surround the support plate and positioned below an edge region of a substrate supported on the support plate; and a top edge electrode positioned above the bottom edge electrode to face the bottom edge electrode and positioned to surround an outer side surface of the gap control plate, and which is fixedly coupled to a bottom end of the electrode plate installed on a ceiling of the housing.

The inventive concept provides a substrate treating method. The substrate treating method includes a treating a substrate by generating a plasma in an edge region of a substrate due to an electrical interaction between a top edge electrode in a ring shape positioned above the edge region, a bottom edge electrode in a ring shape positioned below the edge region, and a support plate applying a power and supporting the substrate; changing a characteristic of the plasma by changing a top/down position of a gap control plate positioned at an inner side of the top edge electrode; and maintaining a gap between a top surface of the support plate and a bottom surface of the gap control plate to a reference gap set according to a recipe while the plasma is generated.

In an embodiment, the support plate moves in a same direction as the gap control plate moves and a same distance as the gap control plate moves to maintain the reference gap.

In an embodiment, a position of the top edge electrode is fixed, and the gap control plate and the support plate are moved in a downward direction, respectively, so a gap between a bottom surface of the top edge electrode and a bottom edge electrode is widened, while the reference gap is maintained.

In an embodiment, a position of the top edge electrode is fixed, and the gap control plate and the support plate are moved in an upward direction, respectively, so a gap between a bottom surface of the top edge electrode and a bottom edge electrode is narrowed, while the reference gap is maintained.

In an embodiment, the gap control plate includes: a dielectric plate positioned to face the support plate and which is made of a material including a dielectric; and a metal plate positioned above the dielectric plate and which is made of a material including a metal.

According to an embodiment of the inventive concept, a substrate may be efficiently treated.

According to an embodiment of the inventive concept, a characteristic of a plasma may be easily changed.

According to an embodiment of the inventive concept, a characteristic of a plasma formed on an edge region of a substrate may be efficiently changed while maintaining a gap between a substrate set according to a recipe and a dielectric plate.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
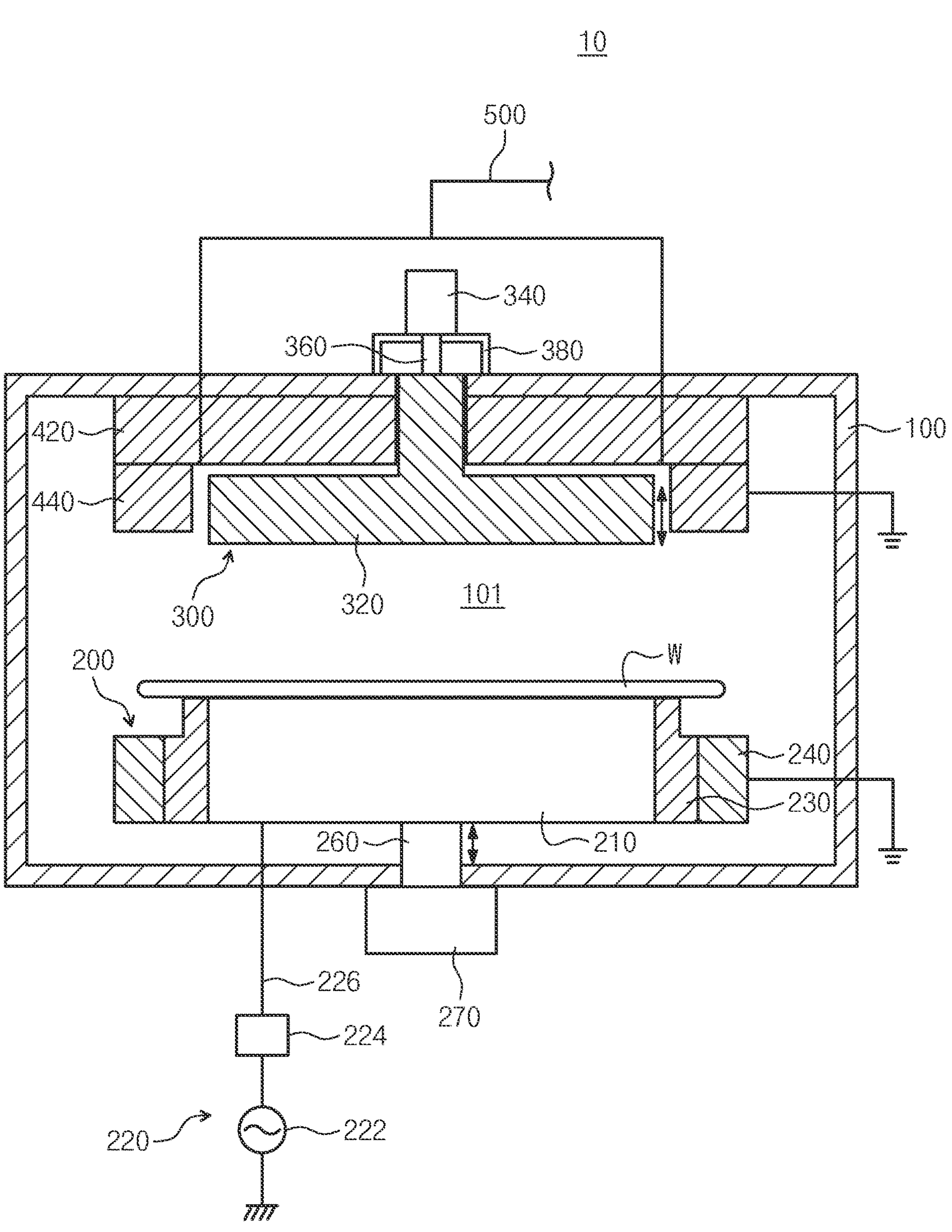
FIG. 1 is a cross-sectional view schematically illustrating a substrate treating apparatus according to an embodiment.

Example embodiments will now be described more fully with reference to the accompanying drawings. Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

When the term "same" or "identical" is used in the description of example embodiments, it should be understood that some imprecisions may exist. Thus, when one element or value is referred to as being the same as another element or value, it should be understood that the element or value is the same as the other element or value within a manufacturing or operational tolerance range (e.g., ±10%).

When the terms "about" or "substantially" are used in connection with a numerical value, it should be understood that the associated numerical value includes a manufacturing or operational tolerance (e.g., ±10%) around the stated numerical value. Moreover, when the words "generally" and "substantially" are used in connection with a geometric shape, it should be understood that the precision of the geometric shape is not required but that latitude for the shape is within the scope of the disclosure.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view schematically illustrating a substrate treating apparatus according to an embodiment.

Hereinafter, the substrate treating apparatus 10 according to an embodiment of the inventive concept will be described in detail with reference to FIG. 1.

The substrate treating apparatus 10 performs a process treatment on the substrate W. The substrate treating apparatus 10 may perform a plasma treatment process on the substrate W. For example, the plasma treatment process performed on the substrate treating apparatus 10 may be an etching process or an ashing process which etches a film on the substrate W. The film may include various kinds of film such as a polysilicon film, an oxide film, a nitride film, a silicon oxide film, and a silicon nitride film. The oxide film described above may be a natural oxide film or a chemically generated oxide film. In addition, the film can be a foreign substance (Byproduct) which occurs in a process of treating the substrate W and is attached to and/or remains on the substrate W.

In the substrate treating apparatus 10 described below, a Bevel Etch process of removing a film existing on an edge region of the substrate W is described as an example. However, it is not limited to this, and the substrate treating apparatus 10 described below can be applied equally or similarly to various processes in which the substrate W is treated using a plasma.

The substrate treating apparatus 10 may include a housing 100, a support unit 200, a plasma control unit 300, and top electrode units 420 and 440.

The housing 100 has a treating space 101 in which the substrate W is treated. The housing 100 generally has a rectangular parallelepiped shape. The material of the housing 100 may include a metal. In addition, an inner surface of the housing 100 may be coated with an insulating material. The housing 100 is grounded.

The support unit 200 is positioned within the treating space 101. The support unit 200 supports the substrate W in the treating space 101. The support unit 200 may include a support plate 210, a power supply unit 220, an insulating ring 230, a bottom edge electrode 240, and a lift unit 260 and 270.

The substrate W is mounted on a top surface of the support plate 210. Accordingly, the substrate W is supported on the support plate 210. The support plate 210 has a substantially circular shape when viewed from above. According to an embodiment, the support plate 210 may have a diameter smaller than that of the substrate W. Accordingly, a central region of the substrate W may be mounted on the top surface of the support plate 210, and the edge region of the substrate W may not contact the top surface of the support plate 210.

The power supply unit 220 applies a power to the support plate 210. The power supply unit 220 may include a power source 222, a matching device 224, and a power line 226. The power source 222 may be a bias power source for applying a bias voltage to the support plate 210. In addition, the power source 222 may be an RF power source which applies a high frequency voltage to the support plate 210. The power source 222 is electrically connected to the support plate 210 through the power line 226. The matching device 224 may be installed on the power line 226 to match an impedance.

The insulating ring 230 is disposed between the support plate 210 and a bottom edge electrode 240 to be described later. According to an embodiment, the insulating ring 230 may be made of an insulating material. Accordingly, the insulating ring 230 electrically separates the support plate 210 from the bottom edge electrode 240. The insulating ring 230 generally has a ring shape. The insulating ring 230 is disposed to surround the support plate 210. More specifically, the insulating ring 230 is disposed to surround an outer circumferential surface of the support plate 210.

According to an embodiment, the insulating ring 230 may have a height of a top surface of an inner region thereof different from a height of a top surface of an outer region thereof. That is, a top surface of the insulating ring 230 may be formed to be stepped. For example, the insulating ring 230 may be stepped so that the height of the top surface of the inner region thereof is higher than the height of the top surface of the outer region. If the substrate W is mounted on the support plate 210, a top surface of the inner region of the insulating ring 230 may contact a bottom surface of the substrate W. On the other hand, even if the substrate W is mounted on the support plate 210, the top surface of the outer region of the insulating ring 230 may be spaced apart from the bottom surface of the substrate W.

According to an embodiment, the bottom edge electrode 240 may be grounded. The material of the bottom edge electrode 240 includes a metal. The bottom edge electrode 240 generally has a ring shape. The bottom edge electrode 240 is disposed to surround an outer circumferential surface of the insulating ring 230. When viewed from above, the bottom edge electrode 240 is positioned in the edge region of the substrate W supported on the support plate 210. More specifically, the bottom edge electrode 240 is positioned below the edge region of the substrate W supported on the support plate 210.

A top surface of the bottom edge electrode 240 may be positioned at the same height as the top surface of the outer region of the insulating ring 230. In addition, the top surface of the bottom edge electrode 240 may be positioned at a height lower than the top surface of the support plate 210. Accordingly, the bottom edge electrode 240 may be spaced apart from the bottom surface of the substrate W supported on the support plate 210. Specifically, the top surface of the bottom edge electrode 240 and the bottom surface of the edge region of the substrate W supported on the support plate 210 may be spaced apart from each other. Accordingly, the plasma to be described later may penetrate a space between the bottom surface of the edge region of the substrate W and the top surface of the bottom edge electrode 240. In addition, the bottom surface of the bottom edge electrode 240 may be positioned at the same height as the bottom surface of the insulating ring 230.

The lift units 260 and 270 lift and lower the support plate 210. When the lift units 260 and 270 lift and lower the support plate 210, the insulating ring 230 combined with the support plate 210 and the bottom edge electrode 240 are also lifted and lowered. The lift units 260 and 270 may be controlled in a synchronization with a plate driver 340 to be described later. More specifically, the shaft driver 270 to be described later is controlled in synchronization with the plate driver 340. A detailed description of this will be described later.

The lift units 260 and 270 may include a support shaft 260 and a shaft driver 270. The support shaft 260 is coupled to the support plate 210. Specifically, the support shaft 260 is coupled to a bottom end of the support plate 210. The support shaft 260 has a vertical lengthwise direction. An end of the support shaft 260 is coupled to the support plate 210, and the other end thereof is connected to the shaft driver 270. The shaft driver 270 moves the support shaft 260 in the top/down direction. Accordingly, the support plate 210 and the substrate W supported on the support plate 210 may move in the top/down direction. The shaft driver 270 may be any one of known motors such as a servo motor, a linear motor, or a pulse motor.

A plasma control unit 300 changes a characteristic of the plasma formed in the treating space 101. More specifically, the plasma control unit 300 changes characteristics of the plasma formed in the edge region of the substrate W supported on the support plate 210. A specific mechanism for changing the characteristics of plasma formed in the edge region of the substrate W using the plasma control unit 300 will be described later.

The plasma control unit 300 is positioned within the treating space 101. The plasma control unit 300 is positioned above the support plate 210. The plasma control unit 300 may include a gap control plate 320 and a plate driver 340.

The gap control plate 320 may have a substantially circular shape when viewed from above. In addition, a bottom portion of the gap control plate 320 may have a disk shape, and a top portion of the gap control plate 320 may have a cylindrical shape. The top portion and the bottom portion of the gap control plate 320 may be made of the same material and may be integrally formed. The top portion of the gap control plate 320 may be inserted into an opening formed at a central portion of the electrode plate 420 to be described later. In addition, the top portion of the gap control plate 320 may be inserted into an opening formed in a center of a ceiling of the housing 100.

The gap control plate 320 is disposed to face the support plate 210. More specifically, the gap control plate 320 is disposed above the support plate 210 to face a central region of the support plate 210. Accordingly, the gap control plate 320 may face the central region of the substrate W supported on the support plate 210. The gap control plate 320 according to an embodiment may be made of a material including a dielectric substance.

A drive shaft 360 may be coupled to a top end of the gap control plate 320. The drive shaft 360 may generally have a rod shape. An end of the drive shaft 360 may be coupled to the top end of the gap control plate 320 and the other end thereof may be connected to the plate driver 340. That is, the plate driver 340 may be coupled to the gap control plate 320 through the drive shaft 360.

The plate driver 340 changes a position of the gap control plate 320. The plate driver 340 moves the drive shaft 360 in the top/down direction. If the plate driver 340 moves the drive shaft 360 in the top/down direction, the gap control plate 320 coupled to the drive shaft 360 also moves in the top/down direction. The plate driver 340 may be any one of known motors which transmit a driving force in a linear direction. The plate driver 340 may be positioned outside the housing 100. The plate driver 340 may be fixed by a bracket 380 positioned outside the housing 100. More specifically, the plate driver 340 can be fixed outside the housing 100 by a bracket 380 coupled to the ceiling of the housing 100.

In addition, the plate driver 340 is controlled in a synchronization with the shaft driver 270 described above. For example, the shaft driver 270 moves the support plate 210 in the same direction as the plate driver 340 moves the gap control plate 320. In addition, the shaft driver 270 moves the support plate 210 by the same distance as the distance the plate driver 340 moved the gap control plate 320.

A synchronization control of the plate driver 340 and the shaft driver 270 is performed by a controller which is not shown. The controller may include a process controller consisting of a microprocessor (computer) that controls the plate driver 340 and the shaft driver 270, a user interface consisting of a keyboard that performs command input operations, or a display that visualizes and displays operational conditions, and a storage unit containing control programs or various data.

The top electrode units 420 and 440 are disposed within the treating space 101. In addition, the top electrode units 420 and 440 are disposed above the support unit 200. The top electrode units 420 and 440 are disposed to surround a side end and a top end of the gap control plate 320. More specifically, the electrode plate 420 described later may surround the top end of the gap control plate 320, and the top edge electrode 440 described later may surround the side end of the gap control plate 320.

The top electrode units 420 and 440 may include an electrode plate 420 and a top edge electrode 440.

The material of the electrode plate 420 includes a metal. According to an embodiment, the material of the electrode plate 420 may include an aluminum. The electrode plate 420 is positioned within the treating space 101. In addition, the electrode plate 420 is positioned above the bottom portion of the gap control plate 320. The electrode plate 420 may be coupled to the ceiling of the housing 100. The electrode plate 420 may have a disk shape. According to an embodiment, a diameter of the electrode plate 420 may be greater than a diameter of the gap control plate 320. In addition, the electrode plate 420 may share its center with the gap control plate 320. An opening into which the top portion of the above-described gap control plate 320 is inserted may be formed in the central part of the electrode plate 420. Accordingly, if the plate driver 340 upwardly and downwardly moves the gap control plate 320, the top portion of the gap control plate 320 may not interfere with the electrode plate 420.

The top edge electrode 440 has a ring shape. The top edge electrode 440 is coupled to a bottom end of the electrode plate 420. More specifically, the top edge electrode 440 is fixedly coupled to a bottom end of an edge region of the electrode plate 420. Accordingly, a position of the top edge electrode 440 is fixed in the treating space 101.

The above-described gap control plate 320 may be positioned under a central region of the electrode plate 420, and the top edge electrode 440 may be coupled to the bottom end of the edge region of the electrode plate 420. That is, the top edge electrode 440 is disposed outside the gap control plate 320 along a circumferential direction of the gap control plate 320. In addition, the top edge electrode 440 may share its center with the gap control plate 320. The material of the top edge electrode 440 may include a metal. According to an embodiment, the top edge electrode 440 may be made of the same or similar material as that of the electrode plate 420. The top edge electrode 440 may be electrically connected to the electrode plate 420. In addition, the top edge electrode 440 may be grounded.

In addition, the top edge electrode 440 is disposed above the edge region of the substrate W. In addition, the top edge electrode 440 is disposed above the bottom edge electrode 240 to face the bottom edge electrode 240. Accordingly, when viewed from above, the top edge electrode 440 may overlap the edge region of the substrate W supported on the support plate 210.

In addition, an inner circumferential surface of the top edge electrode 440 may be disposed to be spaced apart from an outer circumferential surface of the gap control plate 320 by a predetermined distance. A gas line 500 is connected to a gap between the inner circumferential surface of the top edge electrode 440 and the outer circumferential surface of the gap control plate 320. The gap overlaps the edge region of the substrate W when viewed from above. Accordingly, a gas supplied from the gas line 500 may be supplied to the edge region of the substrate W through the space. The gas supplied to the edge region of the substrate W may be a gas excited by the plasma.

Figure 2:
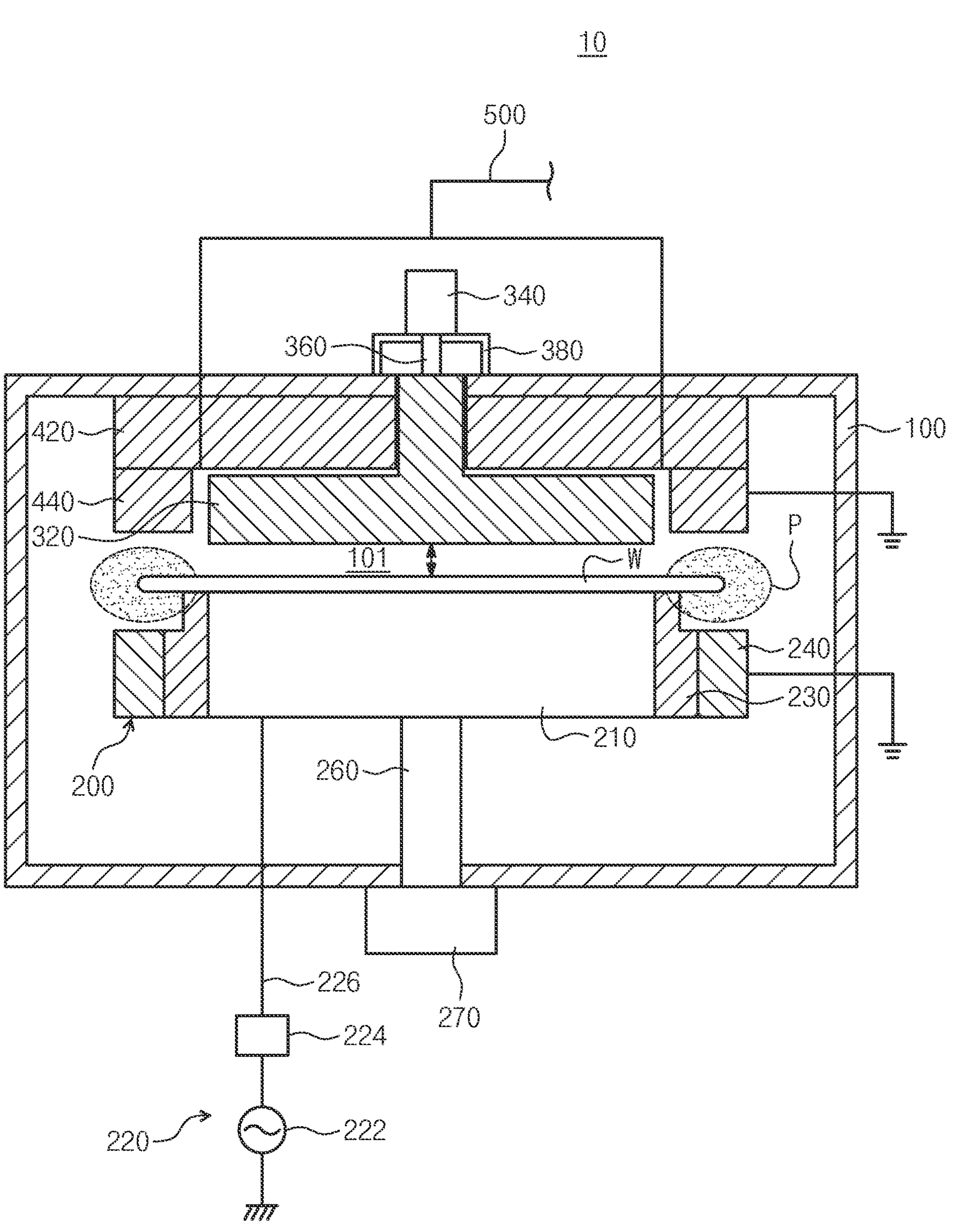
FIG. 2 is a cross-sectional view schematically illustrating a treating of a substrate using a plasma in a substrate treating apparatus according to an embodiment.

FIG. 2 is a cross-sectional view schematically illustrating a treating of a substrate using a plasma in a substrate treating apparatus according to an embodiment.

Referring to FIG. 2, the gas is supplied to an edge region of the substrate W through the gas line 500. The support plate 210, the grounded bottom edge electrode 240, and the grounded top edge electrode 440 to which a high frequency power is applied or a bias power is applied electrically interact with each other to form an electronic field in the edge region of the substrate W. The gas supplied to the edge region of the substrate W by an electric field formed in the edge region of the substrate W is excited to a plasma P state in the edge region of the substrate W. The plasma P formed in the edge region of the substrate W may etch a film formed in the edge region of the substrate W. According to an embodiment of the inventive concept, when the plasma is formed in the edge region of the substrate W, the top surface of the support plate 210 and the top surface of the gap control plate 320 are maintained at regular intervals according to a predetermined recipe.

Figure 3:
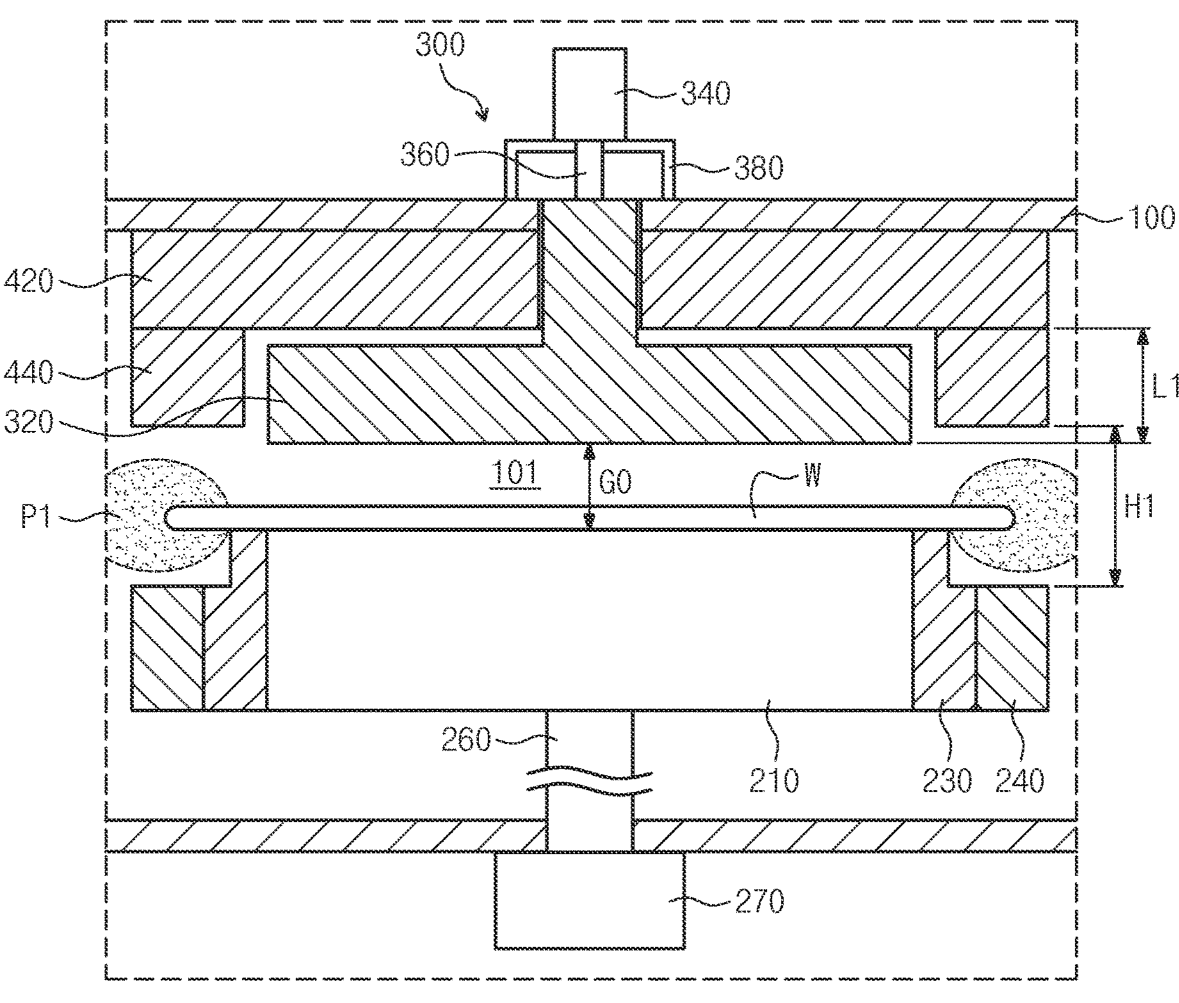
FIG. 3 to FIG. 5 are enlarged views schematically illustrating a plasma control unit changing plasma characteristics according to an embodiment.
Figure 4:
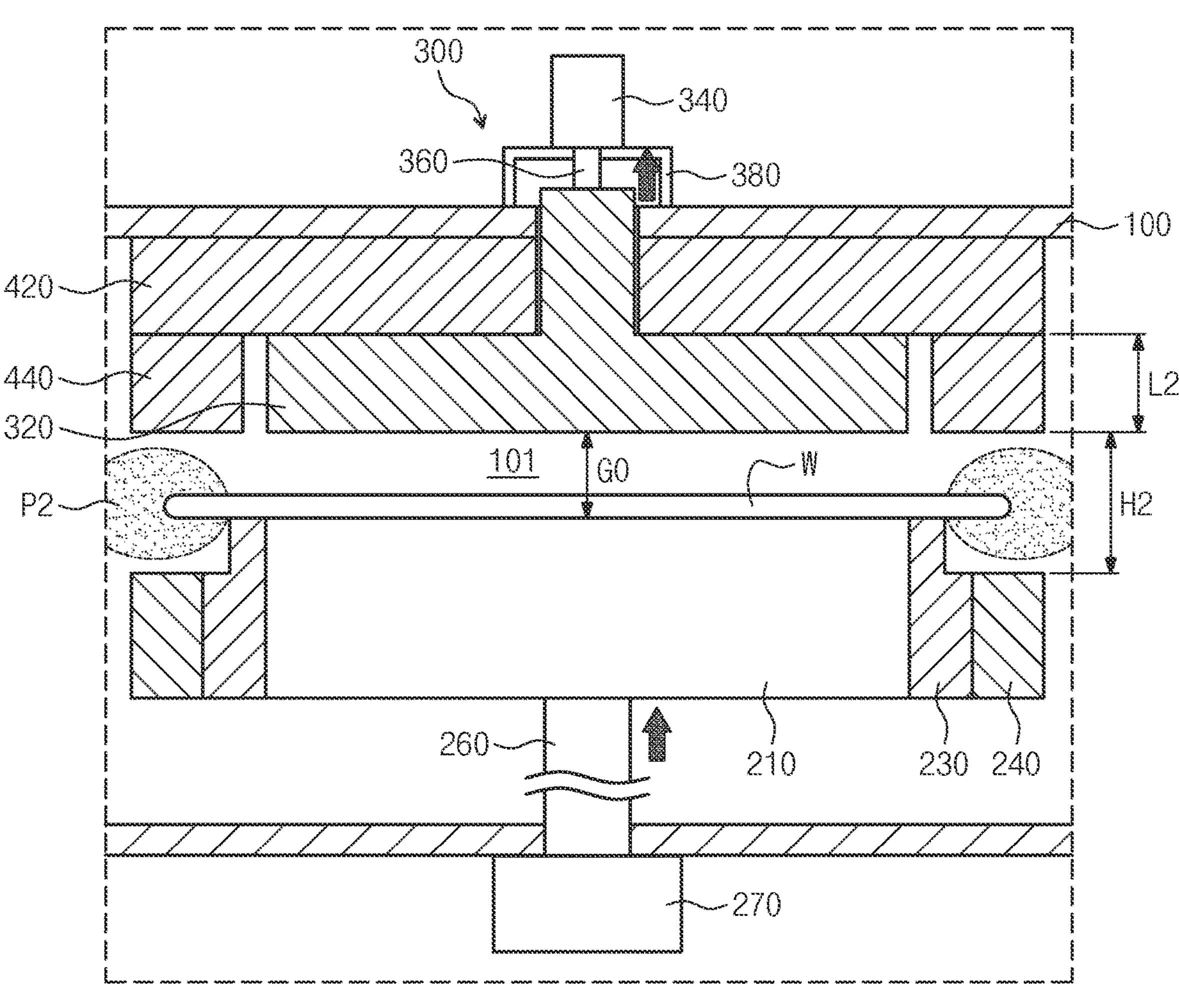
Figure 5:
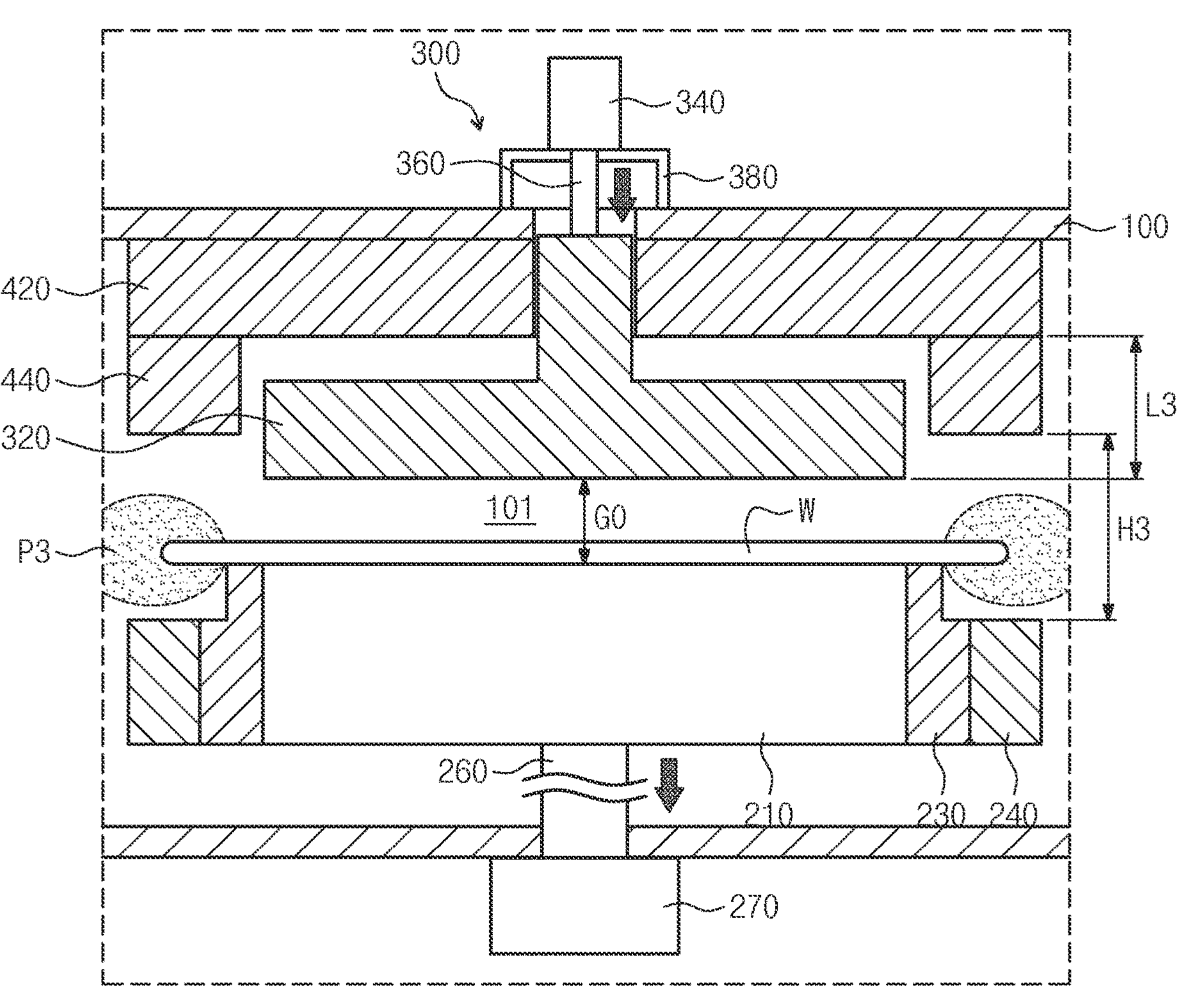

FIG. 3 to FIG. 5 are enlarged views schematically illustrating a plasma control unit changing plasma characteristics according to an embodiment.

Hereinafter, a mechanism by which the plasma control unit according to an embodiment of the inventive concept changes characteristics of the plasma formed in an edge region of the substrate will be described with reference to FIG. 3 to FIG. 5.

Referring to FIG. 3, while the first plasma P1 with a first characteristic is formed in the edge region of the substrate W, a distance between the bottom surface of the gap control plate 320 and the top surface of the support plate 210 is maintained at a reference distance GO determined according to a recipe. As described in FIG. 3, while treating the substrate W using the first plasma P1 formed on the edge of the substrate W, the gap between the top surface of the bottom edge electrode 240 and the bottom surface of the top edge electrode 440 may be maintained at a first gap H1. In addition, while treating the substrate W using the first plasma P1, a vertical distance between the bottom surface of the gap control plate 320 and the top surface of the top edge electrode 440 may be maintained at a first vertical distance L1.

Referring to FIG. 4, the plasma control unit 300 may change a characteristic of the plasma formed in an edge region of the substrate W. For example, the plasma control unit 300 may change the plasma formed in the edge region of the substrate W from the first plasma P1 having the characteristic to a second plasma P2 having a second characteristic.

More specifically, the plate driver 340 may upwardly move the gap control plate 320 by a first distance. The shaft driver 270 is synchronously controlled by a driving of the plate driver 340, upwardly moving the support plate 210 by a first distance. Accordingly, the gap between the bottom surface of the gap control plate 320 and the top surface of the support plate 210 is maintained at the reference interval GO determined according to the recipe. That is, the gap control plate 320 may upwardly move while maintaining the reference interval GO.

When a position change of the gap control plate 320 is completed, the gap between the top surface of the bottom edge electrode 240 and the bottom surface of the top edge electrode 440 may be changed to a second gap H2. The second gap H2 may be a value smaller than the first gap H1 shown in FIG. 3. For example, the second gap H2 may be a value obtained by subtracting a first distance, which is a moving distance of the gap control plate 320, from the first gap H1. That is, when the gap control plate 320 upwardly moves, the gap between the bottom edge electrode 240 and the top edge electrode 440 may be narrowed.

According to the above embodiment, the gap control plate 320 upwardly moves while maintaining the reference distance GO according to the recipe, thereby changing the distance between the bottom edge electrode 240 and the top edge electrode 440. Accordingly, the characteristics of the electric field formed in the edge region of the substrate W may be changed, and the characteristics of the plasma formed in the edge region of the substrate W may be changed.

For example, as the gap between the bottom edge electrode 240 and the top edge electrode 440 narrows, chemical characteristics of the plasma formed in the edge region of the substrate W increase and the physical characteristics decrease. The physical characteristics may mean physically reacting with the film formed in the edge region of the substrate W. The chemical characteristics may refer to chemical reactions with the film formed in the edge region of the substrate W, or a chemical reactivity of the gas supplied to the edge region of the substrate W. That is, as the gap between the bottom edge electrode 240 and the top edge electrode 440 narrows, a gap of the edge region of the substrate W narrows. As the gap of the edge region of the substrate W narrows, it is difficult for the plasma to penetrate into the film formed in the edge region of the substrate W. Accordingly, since it is difficult for the plasma to physically react with the film formed in the edge region of the substrate W, the physical characteristics of the plasma may be reduced. In addition, as the gap of the edge region of the substrate W narrows, a density of the gas supplied to the edge region of the substrate W increases, so the chemical characteristics of the plasma can increase.

Accordingly, the plasma control unit 300 may change the plasma formed in the edge region of the substrate W from the first plasma P1 with the first characteristic to the second plasma P2 with the second characteristic (in which chemical characteristics increase from the first characteristic but physical characteristics decrease).

As shown in FIG. 4, when the position of the gap control plate 320 is changed, a vertical distance between the bottom surface of the gap control plate 320 and the top surface of the top edge electrode 440 may be changed to a second vertical distance L2. The second vertical distance L2 may have a value smaller than the first vertical distance L1 described with reference to FIG. 3. For example, the second vertical distance L2 may be a value obtained by subtracting a first distance, which is a moving distance of the gap control plate 320, from the first vertical distance L1. Since the gap control plate 320 is made of a material containing a dielectric, characteristics of the plasma formed in the edge region of the substrate W may change depending on relative positions of the gap control plate 320 and the top edge electrode 440. For example, a formation range of the plasma formed in the edge region of the substrate W may be changed.

Referring to FIG. 5, the plasma control unit 300 may change the plasma formed in the edge region of the substrate W from the first plasma P1 having the first characteristic to a third plasma P3 having a third characteristic.

For example, the plate driver 340 may downwardly move the gap control plate 320 by a second distance. The shaft driver 270 is synchronously controlled by a driving of the plate driver 340, downwardly moving the support plate 210 by the second distance. Accordingly, the gap between the bottom surface of the gap control plate 320 and the top surface of the support plate 210 is maintained at the reference gap GO determined according to the recipe. That is, the gap control plate 320 may downwardly move while maintaining the reference gap GO.

When a movement of the gap control plate 320 is completed, the gap between the top surface of the bottom edge electrode 240 and the bottom surface of the top edge electrode 440 may be changed to a third gap H3. The third gap H3 may be a value greater than the first gap H1 shown in FIG. 3. For example, the third gap H3 may be a value obtained by adding a second distance, which is a moving distance of the gap control plate 320 to the first gap H1. That is, when the gap control plate 320 downwardly moves, the gap between the bottom edge electrode 240 and the top edge electrode 440 may be widened.

According to the above embodiment, the gap control plate 320 downwardly moves while maintaining the reference distance GO according to the recipe, thereby widening the gap between the bottom edge electrode 240 and the top edge electrode 440. Accordingly, characteristics of the electric field formed in the edge region of the substrate W may be changed, and characteristics of the plasma formed in the edge region of the substrate W may be changed from the first characteristic to the third characteristic (chemical characteristics are reduced more than the first characteristic but physical characteristics are increased). Accordingly, the plasma control unit 300 may change the plasma formed in the edge region of the substrate W from the first plasma P1 having the first characteristic to the third plasma P3 having the third characteristic.

In addition, as described in FIG. 5, when the downward movement of the gap control plate 320 is completed, a vertical distance between the bottom surface of the gap control plate 320 and the top surface of the top edge electrode 440 may be changed to a third vertical distance L3. The third vertical distance L3 may have a value greater than the first vertical distance L1 described with reference to FIG. 3. For example, the third vertical distance L3 may be a value obtained by adding a first distance, which is a moving distance of the gap control plate 320, to the first vertical distance L1. That is, as the gap control plate 320 downwardly moves, the gap control plate 320 moves away from the top edge electrode 440. Accordingly, a formation range of the plasma formed in the edge region of the substrate W may be changed.

According to the aforementioned embodiment, characteristics of the plasma formed in the edge region of the substrate W can be changed by changing a simple position of the gap control plate 320. For example, as the gap control plate 320 moves, the physical characteristics, chemical characteristics, or formation range of the plasma can be efficiently changed. In addition, the substrate can be uniformly treated according to the recipe by maintaining a constant gap between the top surface of the support plate 210 and the bottom surface of the gap control plate 320 according to the recipe determined by the support plate 210 moving in the same direction and distance as a movement of the gap control plate 320 by being sync controlled.

Unlike the aforementioned embodiment, the gap control plate 320 is formed in a disk shape, and the top end of the gap control plate 320 may be directly connected to the drive shaft 360 connected to the plate driver 340.

In the aforementioned example, it has been described as an example that both the bottom edge electrode 240 and the top edge electrode 440 are grounded, but the inventive concept is not limited thereto. For example, a high frequency power may be applied to any one among the bottom edge electrode 240 and the top edge electrode 440, and the other may be grounded. In addition, a high-frequency power may be applied to each of the bottom edge electrode 240 and the top edge electrode 440.

Hereinafter, a plasma control unit according to another embodiment of the inventive concept will be described. The embodiments described below are mostly the same as or similar to the description of the substrate treating apparatus and substrate treating method according to the embodiment described with reference to FIG. 1 to FIG. 5, except for additional illustrations, and thus a description of the overlapping contents will be omitted.

Figure 6:
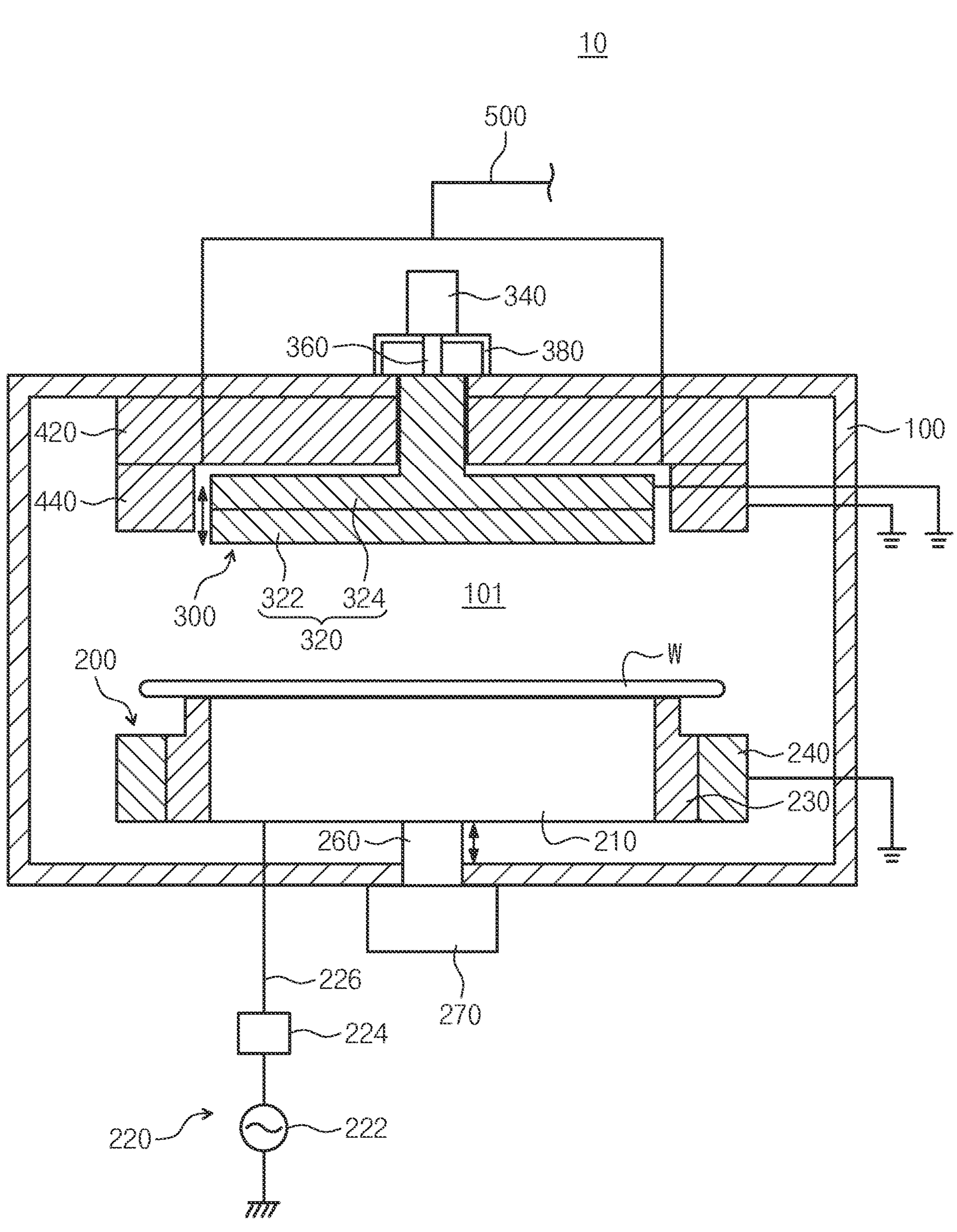
FIG. 6 is an enlarged view schematically illustrating the plasma control unit according to another embodiment.

FIG. 6 is an enlarged view schematically illustrating the plasma control unit according to another embodiment.

Referring to FIG. 6, the gap control plate 320 may include a dielectric plate 322 and a metal plate 324. The dielectric plate 322 is positioned under the metal plate 324. According to an embodiment, the dielectric plate 322 may be coupled to a bottom surface of the metal plate 324. In addition, the dielectric plate 322 is placed above the support plate 210 to face a central edge of the substrate W supported on the support plate 210. The dielectric plate 322 may have a substantially disk shape. That is, the dielectric plate 322 may have a substantially circular shape when viewed from above. In addition, the dielectric plate 322 may be made of a material including a dielectric substance.

The metal plate 324 may be made of a material including a metal. In addition, the metal plate 324 may be grounded. The metal plate 324 is disposed above the dielectric plate 322. A bottom portion of the metal plate 324 may have a substantially disk shape. The metal plate 324 may have the same central axis as the dielectric plate 322. In addition, the bottom portion of the metal plate 324 may have the same diameter as the dielectric plate 322. A top portion of the metal plate 324 may have a cylindrical shape. The top portion part of the metal plate 324 can be inserted into an opening formed in the center of the electrode plate 420 and an opening formed in a ceiling of the housing 100. In addition, the drive shaft 360 may be coupled to a top end of the metal plate 324. Accordingly, the plate driver 340 may be coupled to the top end of the metal plate 324 through the drive shaft 360.

The metal plate 324 according to an embodiment induces a coupling of a bias power or a high frequency power applied to the support plate 210, and contribute to changing characteristics of the electric field or the plasma generated in the edge region of the substrate W. Accordingly, according to the above embodiment, the characteristics of plasma formed in the edge region of the substrate W can be changed in more various ways by placing a metal plate 324 made of a material containing a metal above the dielectric plate 322 which is made of a material including a dielectric.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:

a housing having a treating space;

a support unit positioned within the treating space and configured to apply a power and to support a substrate, the support unit including a support plate;

a plasma control unit configured to change a characteristic of a plasma formed in the treating space; and a top edge electrode positioned above an edge region of the substrate supported on the support plate, wherein a position of the top edge electrode is fixed within the treating space, and wherein the plasma control unit includes:

a gap control plate positioned above the support unit; and a plate driver changing a position of the gap control plate, and the plate driver maintains a gap between a bottom surface of the gap control plate and a top surface of the support plate while changing a characteristic of the plasma by changing the position of the gap control plate;

wherein the plate driver couples with the gap control plate to move the gap control plate in a top/down direction, the support unit further includes a lift unit configured to move the support plate in the top/down direction, and the lift unit moves the support unit in a same direction as the gap control plate moves in a same distance as the gap control plate moves in the top/down direction so the gap between the bottom surface of the gap control plate and the top surface of the support plate is maintained.

2. The substrate treating apparatus of claim 1, further comprising:

a bottom edge electrode positioned to surround the support plate and positioned below an edge region of a substrate supported on the support plate; and the top edge electrode positioned to face the bottom edge electrode, and wherein the bottom edge electrode is moved in the top/down direction together with the support plate by the lift unit.

3. The substrate treating apparatus of claim 2, wherein the plate driver moves the gap control plate and the lift unit moves the support unit, respectively, in a downward direction, so a gap between a bottom surface of the top edge electrode and a top surface of the bottom edge electrode is widened while the gap is maintained.

4. The substrate treating apparatus of claim 2, wherein the plate driver moves the gap control plate and the lift unit moves the support unit, respectively, in an upward direction, so a gap between a bottom surface of the top edge electrode and a top surface of the bottom edge electrode is narrowed while the gap is maintained.

5. The substrate treating apparatus of claim 2, wherein the bottom edge electrode and the top edge electrode are grounded.

6. The substrate treating apparatus of claim 1, wherein the gap control plate is made of a material which includes a dielectric.

7. The substrate treating apparatus of claim 1, wherein the gap control plate includes:

a dielectric plate positioned to face the support plate and made of a material including a dielectric; and a metal plate positioned above the dielectric plate and made of a material including a metal, and the plate driver is coupled to a top end of the metal plate.

8. A substrate treating apparatus comprising:

a housing having a treating space;

a support unit positioned within the treating space and configured to support a substrate, the support unit including a support plate;

a lift unit configured to move the support plate;

a plasma control unit configured to change a characteristic of a plasma formed in the treating space; and a top edge electrode positioned to surround an outer side surface of a gap control plate, and which is fixedly coupled to a bottom end of an electrode plate installed on a ceiling of the housing, and wherein the plasma control unit includes:

the gap control plate positioned above the support unit; and a plate driver moving the gap control plate, and the plate driver changes the characteristic of the plasma by moving the gap control plate, and the lift unit is sync controlled with the plate driver so a gap between a bottom surface of the gap control plate and a top surface of the support plate is maintained at a reference gap set according to a recipe, wherein the plate driver moves the gap control plate in a top/down direction, and the lift unit is sync controlled with the plate driver to move the support unit in a same direction as the gap control plate moves in a same distance as the gap control plate moves so the reference gap is maintained.

9. The substrate treating apparatus of claim 8, further comprising:

a bottom edge electrode positioned to surround the support plate and positioned below an edge region of a substrate supported on the support plate; and the top edge electrode positioned above the bottom edge electrode to face the bottom edge electrode.

10. A substrate treating method comprising:

treating a substrate by generating a plasma in an edge region of a substrate due to an electrical interaction between a top edge electrode in a ring shape fixedly positioned above the edge region, a bottom edge electrode in a ring shape positioned below the edge region, and a support plate applying a power and supporting the substrate;

changing a characteristic of the plasma by changing a top/down position of a gap control plate positioned at an inner side of the top edge electrode; and maintaining a gap between a top surface of the support plate and a bottom surface of the gap control plate to a reference gap set according to a recipe while the plasma is generated, wherein the support plate moves in a same direction as the gap control plate moves and a same distance as the gap control plate moves to maintain the reference gap.

11. The substrate treating method of claim 10, wherein the gap control plate and the support plate are moved in a downward direction, respectively, so a gap between a bottom surface of the top edge electrode and a bottom edge electrode is widened, while the reference gap is maintained.

12. The substrate treating method of claim 10, wherein the gap control plate and the support plate are moved in an upward direction, respectively, so a gap between a bottom surface of the top edge electrode and a bottom edge electrode is narrowed, while the reference gap is maintained.

13. The substrate treating method of claim 10, wherein the gap control plate includes:

a dielectric plate positioned to face the support plate and which is made of a material including a dielectric; and a metal plate positioned above the dielectric plate and which is made of a material including a metal.

* * * * *